United States Patent [19]

Sieck et al.

[11] Patent Number: 5,527,439
[45] Date of Patent: Jun. 18, 1996

[54] CYLINDRICAL MAGNETRON SHIELD STRUCTURE

[75] Inventors: Peter A. Sieck, Santa Rosa; James G. Rietzel, Antioch; Norman E. Allen, Vacaville, all of Calif.

[73] Assignee: The BOC Group, Inc., Murray Hill, N.J.

[21] Appl. No.: 376,859

[22] Filed: Jan. 23, 1995

[51] Int. Cl.⁶ .................................................. C23C 14/35
[52] U.S. Cl. .......................... 204/192.22; 204/192.12; 204/298.11; 204/298.22
[58] Field of Search .................. 204/192.12, 192.22, 204/298.22, 298.11

[56] References Cited

U.S. PATENT DOCUMENTS

| | | | |
|---|---|---|---|
| 3,514,391 | 5/1970 | Hablanian et al. | 204/298.06 |
| 4,356,073 | 10/1982 | McKelvey | 204/192.12 |
| 4,407,708 | 10/1983 | Landau | 204/192.13 |
| 4,410,407 | 10/1983 | Macaulay | 204/192.25 |
| 4,417,968 | 11/1983 | McKelvey | 204/192.12 |
| 4,422,916 | 12/1983 | McKelvey | 204/192.12 |
| 4,443,318 | 4/1984 | McKelvey | 204/298.23 |
| 4,466,877 | 8/1984 | McKelvey | 204/298.23 |
| 4,525,264 | 6/1985 | Hoffman | 204/298.22 |
| 4,619,755 | 10/1986 | Hessberger et al. | 204/298.14 |
| 5,108,574 | 4/1992 | Kirs et al. | 204/298.22 |
| 5,213,672 | 5/1993 | Hartig et al. | 204/298.22 |

FOREIGN PATENT DOCUMENTS

| | | | |
|---|---|---|---|
| 222900A | 4/1984 | German Dem. Rep. | 204/298.14 |
| 3229969 | 4/1983 | Germany | 204/298.22 |
| 55-12732 | 1/1980 | Japan | 204/298.21 |
| 1-215975 | 8/1989 | Japan | 204/298.21 |
| WO92/02659 | 2/1992 | WIPO | 204/298.11 |

OTHER PUBLICATIONS

Chapman, "Glow Discharge Processes: Sputtering and Plasma Etching," New York: John Wiley & Sons, 1980, pp. 196–198.

Wright et al., "Design Advances and Applications of the Rotatable Cylindrical Magnetron," *J. Vac. Sci. Technol. A*, 4(3), May/Jun. 1986, pp. 388–392.

*Primary Examiner*—Aaron Weisstuch
*Attorney, Agent, or Firm*—David A. Draegert; Salvatore P. Pace

[57] ABSTRACT

An improved shield structure for use in a sputtering apparatus for depositing a film on a substrate is disclosed. The cylindrically shaped shield structure, which extends over the ends of a cylindrical sputtering target, has at least one annular structure extending around an outside surface of the shield. The annular structure is dimensioned to interrupt or suppress movement of any arc which might otherwise travel across its outside surface. In a preferred embodiment, the annular structure is a groove capable of trapping any such arc therein and preventing its escape therefrom. In another preferred embodiment, the improved shield structure is electrically isolated such that it is prevented from becoming an anode. In this manner, the electrically isolated shield structure inhibits the formation of severe arcs between it and the cathodic target. Further, with its arc-suppressing annular structure, the electrically isolated shield structure inhibits movement of any such severe arcs which might otherwise travel across the shield surface toward the support blocks, the vacuum chamber or other anode.

19 Claims, 5 Drawing Sheets

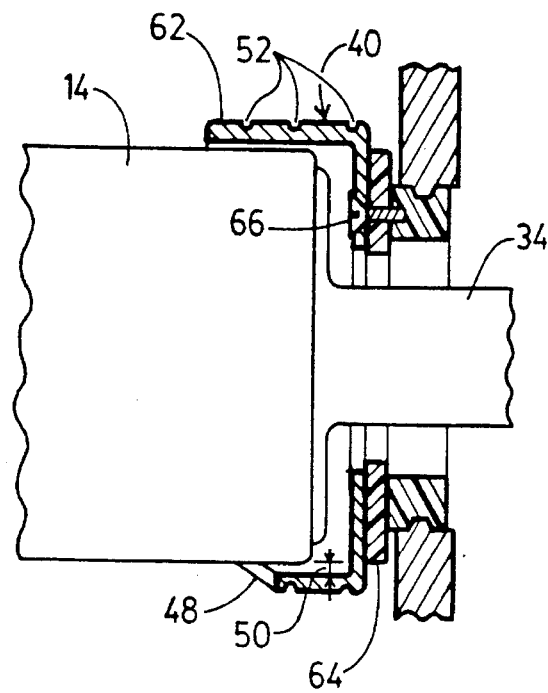
FIG._2.
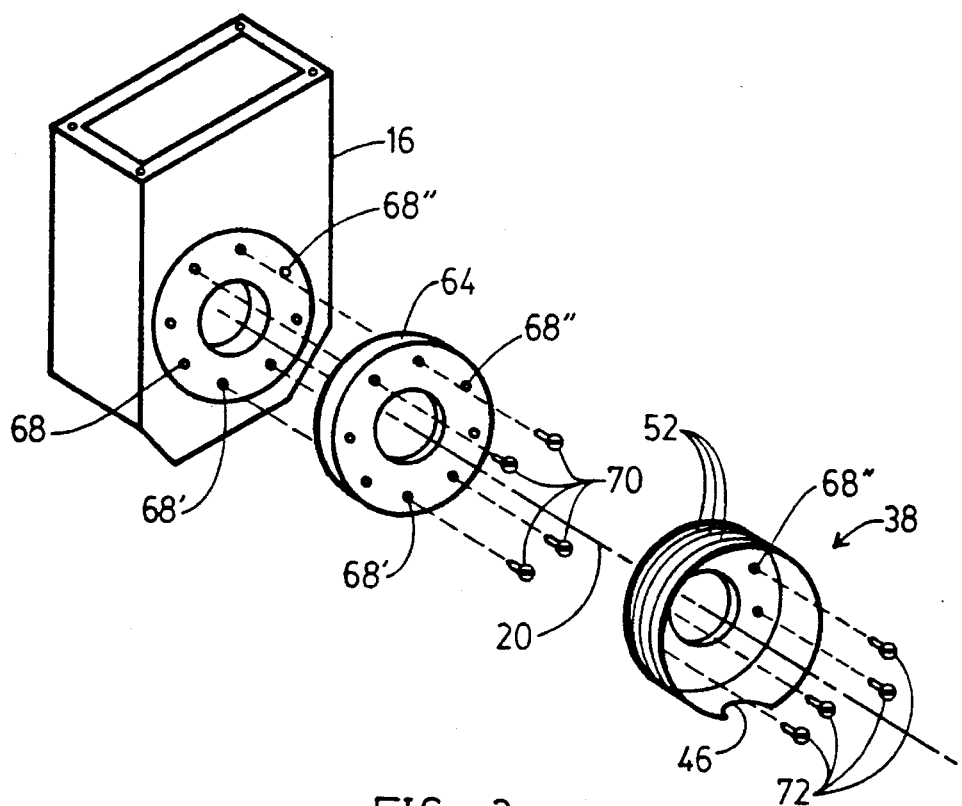
FIG._3.

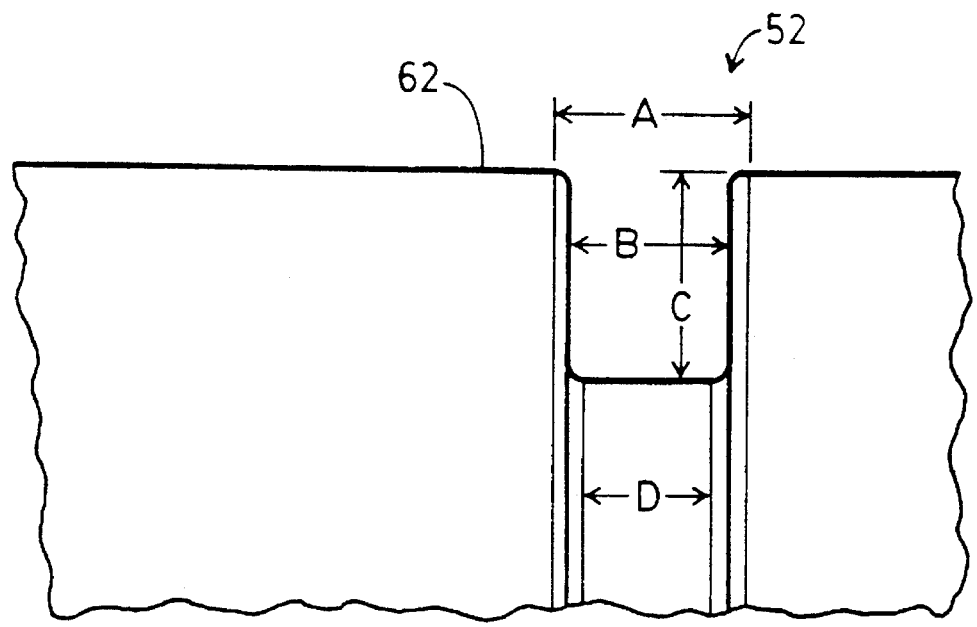
FIG._4.
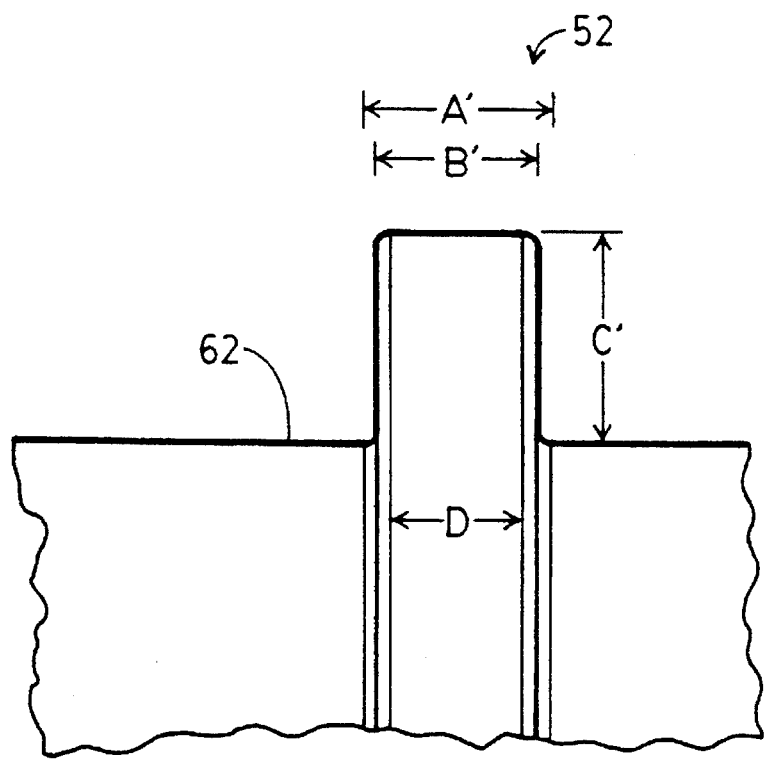
FIG._5.

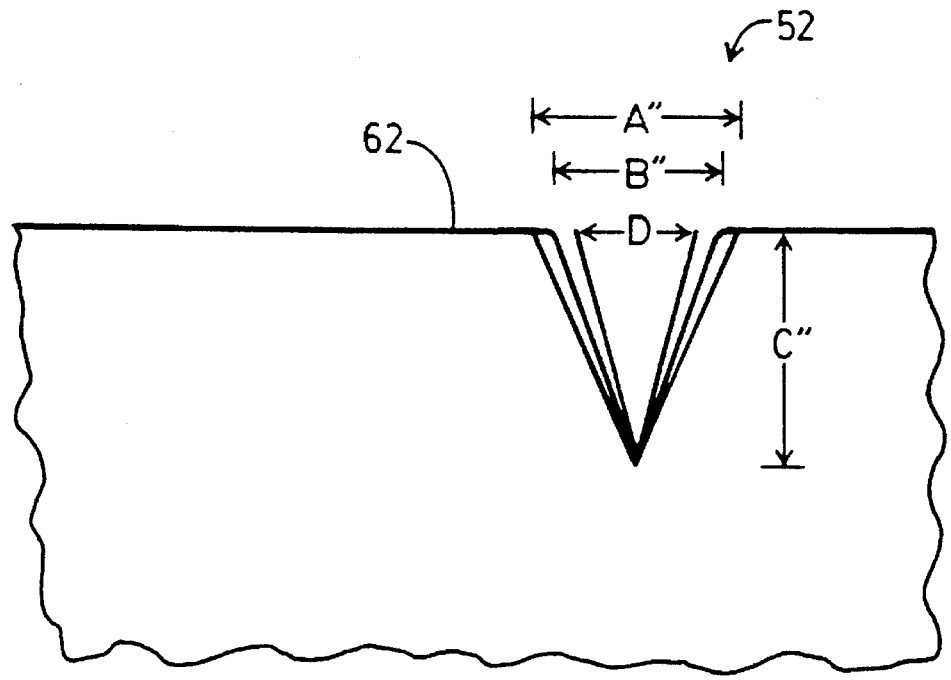
FIG._6.
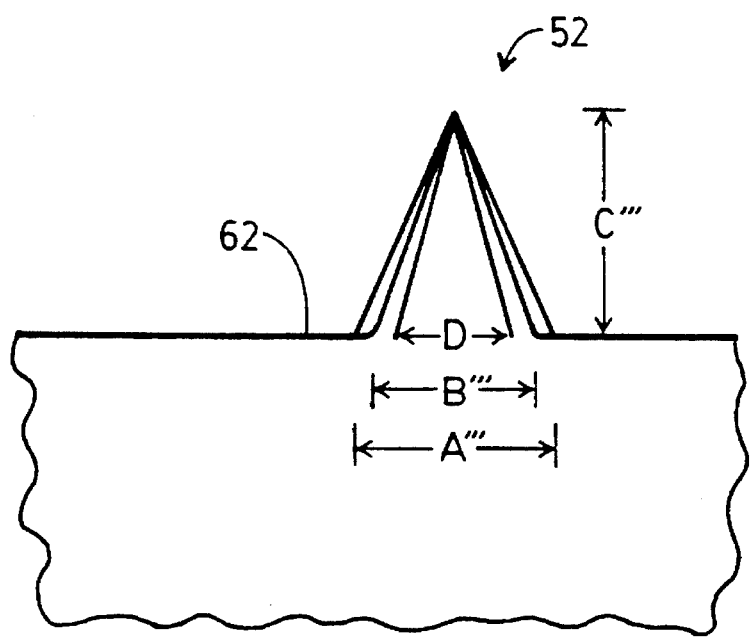
FIG._7.

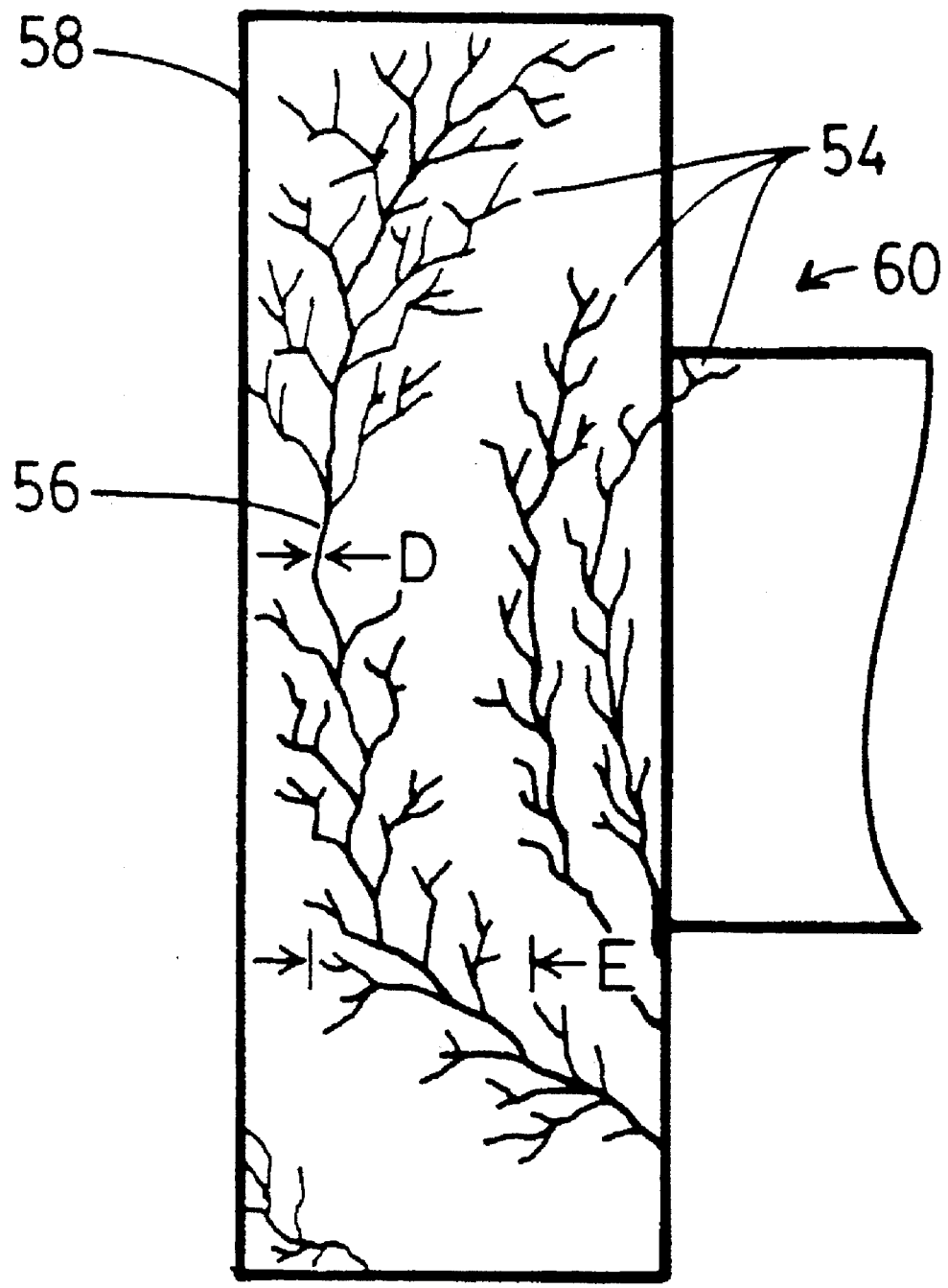
FIG._8.

CYLINDRICAL MAGNETRON SHIELD STRUCTURE

BACKGROUND OF THE INVENTION

This invention relates generally to magnetrons of a type using rotating cylindrical sputtering targets, and, more specifically, to structures and techniques for minimizing arcing in such magnetrons.

Cylindrical magnetrons are becoming widely used for depositing films on substrates. An example is the deposition of a stack of dielectric and metal layers on a surface of a glass substrate for the purpose of filtering out a portion of solar energy from passing through the glass. Such a substrate is positioned within a vacuum chamber containing at least one, and usually two, rotating cylindrical targets containing sputtering material on an outer surface thereof. Both inert and reactive gases are generally introduced into the chamber. A voltage applied to the sputtering target, with respect to either the vacuum chamber enclosure or a separate anode, creates a plasma that is localized along a sputtering zone of the target by stationary magnets positioned within the target. Material is sputtered off the target surface and onto the substrate by bombarding the target with electrons and ions of the plasma as it passes through the stationary sputtering zone.

The magnets are usually of a permanent magnet type, arranged along a line within the rotating cylindrical target and held against rotation with the target. The sputtering zone is created by the magnets along substantially the entire length of the cylindrical sputtering target and extends only a small circumferential (radial) distance around it. Traditionally, the magnets are arranged so that the sputtering zone exists at the bottom of the cylindrical target, facing a substrate being coated directly beneath.

Although deposition of the film is desired to take place only on the substrate, it is also deposited on other surfaces within the reactive chamber. This can create a problem in many situations, especially when certain dielectrics are being deposited as the film. For example, if the target surface is silicon and the reactive gas is oxygen, silicon or aluminum oxides are deposited on the target surface, surfaces of target supporting structures, and the like, as well as on the substrate that is intended to be coated. After a certain build-up of dielectric material on internal vacuum chamber surfaces has occurred over time, arcing to those surfaces can begin. Arcing is undesirable since it generates particles that contaminate the film being deposited on the substrate, and overloads the power supply that creates the plasma through an electrical connection with the sputtering target surface and the vacuum chamber walls or some other anode.

An advantage of a rotating cylindrical sputtering target is that such a film deposited on the target is subjected to being sputtered away as the target surface passes through the sputtering zone, thus counteracting the undesirable film build-up. Despite this self-cleaning characteristic, however, undesirable arcing still occurs in rotary magnetrons under certain circumstances.

A cylindrical magnetron shield structure has been developed to minimize this undesirable arcing that occurs in rotary cylindrical magnetrons. See Kirs et al., "Cylindrical Magnetron Shield Structure," U.S. Pat. No. 5,108,574 (hereinafter, Kirs et al.), which is incorporated herein by this reference. As shown in Kirs et al., the deposition of dielectric film can be minimized by dark space shielding, which prevents plasma formation in the dark space and thereby reduces film deposition and subsequent arcing.

Although the shield structure of Kirs et al. greatly enhances the self-cleaning characteristic of rotary cylindrical magnetrons, some deposition of condensate has been found to occur at the far ends of the target cylinder. Unlike the deposition of dielectric films that concerned Kirs et al., this deposition of condensate from the vapor present in the system occurs regardless of the existence of plasma. Thus, the problem of condensate deposition is not fully resolved by the use of dark space shielding.

Recently, a cylindrical magnetron shield structure has been developed to minimize the occurrence of such condensation deposition and related arcing at the ends of the target cylinder. See Sieck et al., "Cylindrical Magnetron Shield Structure," U.S. patent application Ser. No. 08/308,828, a continuation of U.S. patent application Ser. No. 08/004,964 (hereinafter, Sieck et al.), which is incorporated herein by this reference. Particularly, the shield structure is shaped at its inner edges to conform substantially to a pattern of condensation that results when the magnetron is operated with the target held stationary. The shaped shield structure is positioned with respect to the target to shield regions where condensation of vaporized material would otherwise occur at a rate which exceeds the rate at which deposited condensate is removed from the target by sputtering. Use of the shaped shield structure of Sieck et al. greatly reduces condensate deposition at the ends of the target and related arcing activity.

However, even slight deposition of dielectric or insulating material at the ends of the target may result in undesirable arcing activity. Generally, when the condensate build-up approaches ground or vacuum chamber potential, arcs to the condensate surface appear to travel across the condensate surface toward the vacuum chamber wall or other anode.

Additionally, prior to the present invention, rotatable magnetrons have been configured such that the shield structure is at ground, vacuum chamber potential or cathode potential. In these magnetrons, the shield structure has proven to be a site of preferential arcing from the cathode to the vacuum chamber wall or other anode.

It is a principal object of the present invention to provide a mechanism and technique for minimizing such undesirable arcing activity.

SUMMARY OF THE INVENTION

This and additional objects are accomplished by the present invention, wherein, briefly and generally, a cylindrical shield structure is provided which has an annular structure extending around its outside surface, wherein the annular structure is dimensioned to interrupt movement of any arc which might otherwise travel across its outside surface. In a preferred form, the shield structure is electrically isolated from ground, vacuum chamber or other anode potential.

In a cylindrical rotatable magnetron system, it is apparent that arcing occurs between the cathodic target and an anode of the system. Particularly, it has become apparent that condensate build-up at the ends of the target often approaches or reaches ground, vacuum chamber or anodic potential and thus, potentiates severe arcs which travel across the condensate surface. In situations where the condensate build-up contacts the shield structure such that the shield structure becomes an anode, arcs traveling across the shield structure are particularly severe because of the close proximity of the shield structure and the cathode.

The shield structure of the present invention serves to suppress the movement of any such arcs that might otherwise travel across the outside surface of the shield structure toward the vacuum chamber walls or other anode. Generally, the shield structure comprises at least one annular structure extending around its outside surface. Preferably, a width of the annular structure is greater than a width of an arc, so that the arc is sufficiently disrupted and prevented from circumventing the wider annular structure. Additionally, the annular structure width is preferably less than one-half of a mean free path of the gas within the vacuum chamber, a dimension too small to permit collision of the gaseous molecules, so that the plasma is sufficiently disrupted by the annular structure. In this manner, the annular structure may act as a dark space which traps the arc and thereby, interrupts its otherwise natural movement across the shield structure. Preferably, the annular structure extends radially with respect to the outside surface of the shield structure. The radial extent of the annular structure is preferably greater than the annular structure width, so that an arc traveling across the surface of the shield structure encounters a sufficiently abrupt surface transition, or a sufficient obstacle to arc movement. While the annular structure may take a variety of forms, preferably it is a groove having the above-described dimensions, which is indented with respect to the outside surface of the shield structure.

As summarized above, because of the proximity of the shield structure and the cathode, arcing is particularly severe when the shield structure becomes an anode. Thus, preferably, the shield structure is electrically isolated from ground, vacuum chamber or other anode potential. Particularly in situations where the condensate build-up fills the shield structure or contacts the target from the shield structure, the electrically isolated, or floating, shield structure is prevented from becoming an anode.

The present invention thus reduces arcing activity by minimizing the size or extent of movement of any arcs which might occur. The present invention further reduces the severity of any such arcing activity and the damage caused thereby.

Additional objects, features and advantages of the present invention will become apparent from the following description of a preferred embodiment thereof, which description should be taken in conjunction with the accompanying drawings.

BRIEF DESCRIPTION OF THE DRAWINGS

FIG. 2 shows a cross-section of a portion of a target assembly of FIG. 1, including the improvement of the present invention;

FIG. 3 shows in isometric view a portion of a target assembly of FIG. 1, in disassembly, including the improvement of the present invention;

FIG. 4 is a cross-section of a portion of a cylindrical shield structure, including the improvement of the present invention;

FIG. 5 is a cross-section of a portion of a cylindrical shield structure, including an alternative embodiment of the improvement of the present invention;

FIG. 6 is a cross-section of a portion of a cylindrical shield structure, including another alternative embodiment of the improvement of the present invention;

FIG. 7 is a cross-section of a portion of a cylindrical shield structure, including yet another alternative embodiment of the improvement of the present invention; and FIG. 8 is an illustration of an arc pattern, as observed on the support block and the target of a previous cylindrical sputtering target magnetron, showing an "arc-width" which is used to define, in part, the improvement of the present invention.

DESCRIPTION OF PREFERRED EMBODIMENTS

Figure 1:
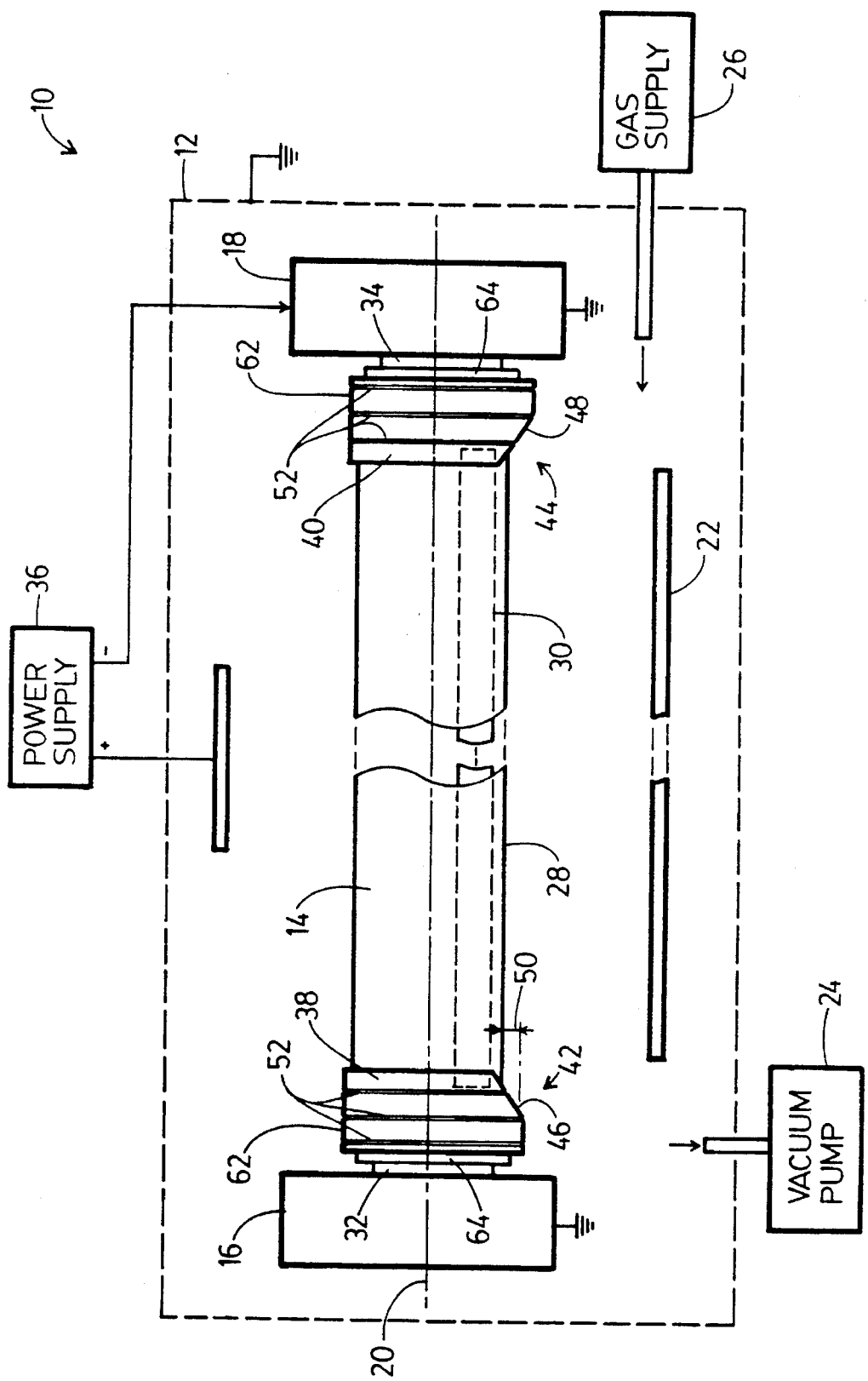
FIG. 1 schematically illustrates a cylindrical sputtering target magnetron, including the improvement of the present invention.

As a precursor to the description of the various embodiments of the present invention, a general description is provided of a cylindrical rotatable magnetron system in which the present invention is used. In FIG. 1, a representative configuration of a cylindrical rotatable magnetron system 10 is shown. A box 12, shown in dotted outline, indicates metallic walls of a vacuum chamber in which the sputtering occurs. Within the vacuum chamber is a rotatable cylindrical target structure 14 which is held by the frame 12 via support blocks 16 and 18 in a manner to be rotatable about its longitudinal axis 20.

Although one target structure is illustrated in FIG. 1, in many applications two or more such targets may be used. Particularly, it is common to use two target structures, as disclosed by Kirs et al.

The magnetron 10 of FIG. 1 is shown to have a substrate 22, which is typically supported by some kind of support structure (not shown). For example, the support structure may comprise rollers to allow the substrate 22 to be passed through the vacuum chamber 12 in a continuous process. A vacuum is drawn within the vacuum chamber by an appropriate pumping system 24. One or more gases are provided by a supply 26 to the vacuum chamber by some convenient delivery system, such as a perforated tube (not shown) positioned across the vacuum chamber. The particular gases utilized depend primarily upon the film desired to be deposited on the substrate 22.

A cylindrical section 28 of sputtering material is provided as part of the target structure 14. The sputtering material is selected according to the intended composition of the film to be deposited on the substrate 22. An electric motor source (not shown), positioned outside the vacuum chamber, rotates the target structure 14. This target rotation may be facilitated by rotating a spindle 32 or 34 (see spindle 34 of FIG. 2, for example) which is in contact the target 14, as is known in the art.

A plasma is created within the vacuum chamber by applying a voltage from a power supply 36 to the sputtering surface 28 which is negative with respect to the vacuum chamber walls 12, the support blocks 16 and 18 or some other anode, which is usually connected to ground potential. As schematically shown in FIG. 1, the power supply 36 is in electrical communication with the target 14, being connected thereto through an anode within the vacuum chamber, such as support block 18. The plasma is positioned adjacent a sputtering zone of the cylindrical sputtering target 14, as controlled by the positioning of magnets (not shown).

These magnets are positioned along the length of the cylindrical sputtering target 14, while extending a small circumferential, or radial, distance therearound. The magnets are most conveniently held within the sputtering target 14 by attachment to a coolant conduit (not shown). The coolant conduit is provided as part of the target structure 14 in a manner to be rotatable independently of the rotation of the target structure, as is known in the art. Thus, the position of the magnets in the target structure 14 and the consequent position of the sputtering zone, is controlled by rotation of the coolant conduit. In operation, the magnets are non-rotatably held within the target 14 to establish a stationary sputtering zone extending along a length of the target. In FIG. 1, an oblong 30, shown in dotted outline, generally represents the position of the magnets which defines the sputtering zone.

A cooling liquid supply and exhaust system (not shown) outside the vacuum chamber provides coolant into the conduit and exhausts the heated coolant from a space between the outside of the conduit and an interior surface of the spindle 32 or 34, as is known in the art. An electrical and electronic control system (not shown) operates to control the various parameters of the magnetron system being described. The cylindrical rotatable magnetron system in which the shield structure of the present is used may be operated under various operating conditions, including high current conditions, upwards of 100 amps.

The improvement of the present invention is implemented in the system of FIG. 1 by providing at least one cylindrically shaped shield structure (shown as 38 and 40 in FIG. 1) around and spaced from the cylindrical target surface. The details of the improvement are described following a description of the general form of the cylindrically shaped shield structure.

The cylindrical shield structure may take the general form of the unified shield structure described in Kirs et al. Preferably, the unified shield embodiment of the present invention takes the form of the shaped unified shield described in Sieck et al. When the shield structure of the present invention is in a unified shield form, the unified shield structure may be carried by one of the support blocks 16 and 18 of FIG. 1, but preferably, is carried by both support blocks.

This cylindrically shaped unified shield extends around a portion of a circumference of the target that is substantially outside of the sputtering zone, so that this non-sputtering portion of the target is shielded. Additionally, the unified shield structure has an opening which is at least as large as the sputtering zone. This opening, which does not extend to the full length of the shield, extends around a portion of the circumference of the target that is substantially inside the sputtering zone, so that the sputtering portion of the target is exposed.

Alternatively, the shield structure may take the general form of two separate shield structures, as described in Hartig et al., U.S. Pat. No. 5,213,672, entitled "Sputtering Apparatus With A Rotating Target," which is incorporated herein by this reference. Preferably, the dual shield structure embodiment of the present invention takes the form of the two shaped shield structures described in Sieck et al. when the shield structure is in the dual shield form, as shown in FIG. 1, a first shield structure 38 is carried by support block 16, while a second shield structure 40 is carried by support block 18.

The preferred, shaped form of the unified shield or dual shield embodiments of the shield structure is now described. Particularly, the unified shield opening, which leaves the sputtering zone exposed, is shaped to conform substantially to a shape of a pattern of condensation of vaporized material that forms when the target is held stationary. The unified shield thus shields regions where condensation of vaporized material might otherwise occur at a rate at which deposited condensate is removed from the target by sputtering. In the dual shield embodiment, the first and second shields are shaped as described above and positioned to shield the above-described regions.

Thus, in the preferred, shaped form, the shield structure exposes an operationally defined effective sputtering zone, while shielding regions of the target where condensation might otherwise occur. By shielding these defined regions, the preferred shaped shield structure minimizes the formation of undesirable condensation at the end portions of a cylindrical sputtering target assembly and thereby, reduces the often catastrophic arcing that results therefrom.

Whether the shield structure takes the unified shield or dual shield form, at least one shield structure extends over at least one end of the opposite ends 42 and 44 of the target structure 14 that is associated therewith. For example, as shown in FIG. 1, shield 38 and opposite shield 40 respectively extend over end 42 and opposite end 44 of the target. Additionally, the shield structure may extend in length beyond the end of the sputtering material in order to cover exposed surfaces of an adjacent spindle and its supporting structure. For example, as shown in FIG. 2, shield 40 covers the exposed surfaces of spindle 34.

It will be noted from FIGS. 1 and 2 that an annular space 50 exists between an outside surface of the target 14 and an inside surface of the cylindrically shaped shield structure. The radial size of annular space 50 is selected to avoid plasma formation between these two surfaces. The radial size of the annular space 50 is typically significantly less than one inch and preferably, less than substantially one-quarter of an inch, for example, one-eighth of an inch.

The present invention is now described with respect to the dual shield embodiment shown in FIG. 1–3, wherein shields 38 and 40 are shown to have the preferred, shaped portions 46 and 48, respectively, and in terms of the particular features shown in FIGS. 4–8. While the present invention is described in terms of the preferred, shaped form of the dual shield embodiment, aspects of the invention described herein are equally applicable in the unified shield and other embodiments described herein.

According to the improvement of the present invention, the shields 38 and 40 have at least one annular structure 52 extending around their outside surfaces. The annular structure 52 is designed to suppress or interrupt movement of any arc which might otherwise travel across the outside surface of the shield structure.

Particularly, in a cylindrical rotatable magnetron system, it is apparent that arcing occurs between the cathodic target and an anode of the system. The present inventors have noted evidence of arcing activity in such a system, in the form of an arc pattern on the target ends and the support blocks. As illustrated in FIG. 8, the arc pattern may consist of several arc tracings 54, representative of arcs, which appear to travel in a lightning-bolt manner across the surface of the support block 58 and the target end 60 of such a system. The arc tracings 54 indicate that the arcs tend to travel annularly (with respect to longitudinal axis 20) around these surfaces. The arc tracings 54 further show the arcs to have a primary arc 56, traveling in a certain direction, and multiple branches, branching from the primary arc and traveling in substantially the direction of the primary arc. For convenience, the arc pattern will be described herein in terms of the primary arc 56 and the arc-width D thereof, as opposed to the arc tracings 54 and the branch-width E thereof.

It is believed that the arcing activity observed in previous cylindrical rotatable magnetron systems results from condensate build-up at the ends of the target. As the condensate build-up approaches or reaches ground, vacuum chamber or anodic potential, arcs to the condensate surface appear to travel across the condensate surface toward the ground source, vacuum chamber wall or other anode. Such arcing activity causes significant damage to the target structure and the support blocks, as illustrated in FIG. 8, and other system structures over which the arcs travel.

Shields 38 and 40 are used to minimize condensate build-up and thus, to reduce the potential for, and the extent of, any such arcing activity. Further, these shields are designed with annular structures 52 to suppress or interrupt movement of any arc which might otherwise travel across the outside surface of the shield structure. In this latter respect, the shield structure of the present invention is effective in the suppression of arcs which are particularly severe, given the close proximity of the cathodic target 14 and the shield structure.

According to the present invention, the annular structure 52 of the shield 38 or 40 is generally a full or partial ring, which is annularly disposed with respect to longitudinal axis 20 and radially extended with respect to the outside surface 62 of the shield 38 or 40. By way of example, as shown in FIGS. 1–3, shields 38 and 40 may have three annular structures 52, one of which is a partial ring, accommodating the shaped portion 46 and 48 of the respective shields, and the remaining two of which are full rings.

The annular structure 52 may take a variety of forms. For example, as shown in FIGS. 6 and 7, the annular structure 52 may be substantially triangular in shape, having a width B" or B'" which forms the base of a triangle and a radial extension C" or C'" which forms the altitude of the triangle. Preferably, the annular structure 52 is substantially rectangular in shape, as shown in FIGS. 4 and 5, having a width B or B' and a radial extension C or C' which form adjacent sides of a rectangle.

As shown in FIGS. 5 and 7, the annular structure 52 may take the form of a ridge, such that the annular structure radial extension C' or C'" is directed outwardly with respect to the outside surface 62 of the shield structure. Preferably, the annular structure 52 is in the form of a groove, as shown in FIGS. 4 and 6, such that the annular structure radial extension C or C" is directed inwardly with respect to the outside surface 62 of the shield structure. In the latter form, the groove may actually trap an arc and thereby, prevent its further travel across the outside surface 62 of the shield structure.

According to the present invention, the annular structure 52 may be particularly dimensioned to achieve arc suppression. Generally, the dimensions of the annular structure 52 are such that any arc, such as arc 56 of FIG. 8, which might be generated within the vacuum chamber and thus, potentially encounter the annular structure, is sufficiently disrupted and obstructed in its travel path by the annular structure. Thus, the annular structure 52 should be of sufficient width and radial extension to interrupt or obstruct the travel path of the arc. Preferably, however, the annular structure 52 should not be wide enough to support plasma formation in its vicinity.

More particularly, the annular structure 52 may be specifically dimensioned in terms of width and radial extension, as shown in FIGS. 4–7 and defined in terms of the arc-width D of FIG. 8. An approach to, or beginning of, the annular structure 52 has a width A, A', A" or A'", which need not be, but typically is greater than a width B, B', B" or B'", respectively, of the annular structure. The approach may be rounded, sanded or filed to prevent injury in the handling of the shield structure 52. Preferably, however, the approach is not too smooth, but rather fairly abrupt, to ensure that the arc is sufficiently interrupted.

In a preferred embodiment, the annular structure 52 has a width B, B', B" or B'" that is less is than one-half of a mean free path of the gas within the vacuum chamber. Preferably, the annular structure width B, B', B" or B'" is also greater than a width D of an arc which might otherwise travel across the outside surfaces of the shields 38 and 40. As shown in FIG. 8, an arc-width D may be approximated by the width D of a burn spot of a primary arc 56, observed in an arc tracing 54 on a surface within a cylindrical rotatable magnetron system. Additionally, the annular structure preferably has a radial extension C, C', C" or C'" that is greater than its respective width B, B', B" or B'".

In the preferred grooved embodiments of FIGS. 4 and 6, the annular structure 52 is thus wide enough to capture an arc in the groove and deep enough to trap the captured arc. However, the annular structure 52 is also sufficiently narrow such that plasma formation in the groove and its vicinity is minimized. Particularly, as the groove width B or B" is less than one-half of the mean free path of the gas, the annular groove 52 reduces the potential for, or number of, collisions between gaseous molecules and thus, minimizes or eliminates plasma formation in the groove and its vicinity.

Thus, when the annular structure 52 is in the preferred form of a groove, it acts as a both an arc-trap and a dark space. The groove is preferably flat-bottomed, as shown in FIG. 4, so that any trapped arc rests in the groove. In this manner, the annular groove traps the arc, interrupting its otherwise natural movement across the shield structure, and further inhibits its ability to escape the trap.

In addition to the dimensional aspects described above, the annular structure 52 should have dimensions that are conveniently machinable. The annular structure width B, B', B" or B'" may be greater than or equal to about 0.005 of an inch, which is the approximate arc-width D of an arc 56 evidenced in a cylindrical rotatable magnetron system. Alternatively, the annular structure width B, B', B" or B'" may be greater than or equal to about 0.01 of an inch, which is the approximate arc-width D of another arc 56 evidenced in a cylindrical rotatable magnetron system.

Further, the annular structure width B, B', B" or B'" may be less than or equal to about one-eighth of an inch or, alternatively, less than or equal to about one-sixteenth of an inch. Each of these alternative annular structure widths represents one-half of a typical mean free path distance operative in a cylindrical rotatable magnetron system. As is known in the art, the mean free path of a gas within the vacuum chamber 12 depends on various operational parameters, including pressure, temperature and the composition of the gas.

The inventors have discovered that a shield structure placed between the target and a ground source or other anode can become anodic during the operation of a cylindrical rotatable magnetron system. Because of the close proximity of the shield structure and the cathodic target, such anodic behavior results in severe arcs which travel from the cathodic target, across the anodic shield structure and toward a ground source or other anode, such as the support block or vacuum chamber. While some systems employ an insulator between the shield structure and the support block, these severe arcs travelling across the anodic shield surface often jump across the insulator surface to the support block or other anode.

Thus, in a preferred embodiment of the present invention, the shield structure is electrically isolated from ground, vacuum chamber or other anode potential. This electrical isolation inhibits the ability of the shield structure to approach or reach ground or anodic potential. Rather, the shield structure is allowed to float between cathodic and anodic potential.

In this manner, the electrically isolated shield structure inhibits the formation of severe arcs between it and the cathodic target 14. Further, with its arc-suppressing annular structure 52, the shield structure of the present invention inhibits movement of an arc which might otherwise travel across its surface toward the support blocks 16 and 18 or vacuum chamber 12.

The electrically isolated shield structure is now described with reference to FIGS. 1–3. As schematically shown in FIG. 1, the electrical power supply 36 controls the potential of the cathodic target 14 by way of its connection thereto through the anodic or ground support block 18. The vacuum chamber 12 and support block 16 are also shown at ground potential. The shields 38 and 40 are shown to be free of any direct voltage control.

As shown in the assembly of FIG. 2, the shield 40 is not physically connected to the cathodic target 14. Additionally, the shield 40 is separated from the ground or anodic support block 18 by an insulator 64. The insulator 64 is typically about three-eighths of an inch thick and thus, the separation distance between the shield and the support block 18 may also be about three-eighths of an inch. While physically separated from support block 18, the shield 40 is indirectly supported thereby by a screw 66, bolt or equivalent means which secures the shield and the insulator to the support block 18.

A similar configuration is shown in disassembly in FIG. 3. In this configuration, support block 16, insulator 64 and shield 38 are equipped with apertures 68 which accommodate a screw-type, bolt-type or other equivalent assembly. By way of example, screws 70 are used to affix insulator 64 to support block 16 through accommodating, corresponding screw-type apertures 68' in the insulator and the support block. Similarly, screws 72 are used to affix the shield 38 to the insulator 64 and/or the support block 16 through accommodating, corresponding screw-type apertures 68" in the shield, the insulator and/or the support block. It is understood that other accommodating structures, such as sleeves placed between the shield structure and the target tube to accommodate various shield or target tube sizes, can be employed in the assembly of the cylindrical rotatable magnetron system.

The shield structure of the present invention reduces arcing activity in cylindrical rotatable magnetron systems by inhibiting the propagation of any arcs which might otherwise travel across the shield structure toward a ground source or other anode.

Although the present invention has been described with respect to a preferred embodiment thereof, it will be understood that the invention is entitled to protection within the full scope of the appended claims.

It is claimed:

1. In an apparatus for depositing, in a gaseous atmosphere within a vacuum chamber, a film onto a substrate by sputtering material from a cylindrically shaped target that is rotatably carried at opposite ends thereof by respective support blocks, said target containing magnets non-rotatably held therein in order to establish a sputtering zone extending along a length of the target, said apparatus including an electrical power supply in electrical communication with said target, and said apparatus including at least one cylindrically shaped shield structure carried by at least one of said support blocks and extending over at least one associated end of the target with a space therebetween, an improvement wherein said shield structure comprises at least one annular structure extending around an outside surface thereof, said at least one annular structure dimensioned to interrupt movement of any arc which might otherwise travel across said outside surface.

2. The apparatus of claim 1 in which said annular structure is dimensioned to interrupt plasma formation which might otherwise occur in a vicinity of said annular structure.

3. The apparatus of claim 1 in which said at least one annular structure has a width that is less than one-half a mean free path of the gas within the vacuum chamber and greater than a width of said arc, said annular structure additionally being radially extended with respect to said outside surface, such that a radial extension thereof is greater than said annular structure width.

4. The apparatus of claim 3 in which said annular structure is substantially rectangular in shape, said annular structure width and said radial extension forming adjacent sides of a rectangle.

5. The apparatus of claim 3 in which said annular structure is substantially triangular in shape, said annular structure width forming a base of a triangle and said radial extension forming an altitude of said triangle.

6. The apparatus of claim 3 in which said annular structure is a groove, said radial extension being directed inwardly with respect to said outside surface.

7. The apparatus of claim 3 in which said annular structure is a ridge, said radial extension being directed outwardly with respect to said outside surface.

8. The apparatus of claim 3 in which said annular structure has a width that is greater than or equal to about 0.005 of an inch.

9. The apparatus of claim 8 in which said annular structure width is greater than or equal to about 0.01 of an inch.

10. The apparatus of claim 3 in which said annular structure has a width that is less than or equal to about one-eighth of an inch.

11. The apparatus of claim 10 in which said annular structure has a width that is less than or equal to about one-sixteenth of an inch.

12. The apparatus of claim 1 in which said shield structure is electrically isolated from ground potential or a potential of said at least one support block.

13. The apparatus of claim 1 in which said space between said shield structure and said target is less than about one-quarter of an inch.

14. The apparatus of claim 1 in which said at least one cylindrically shaped shield structure comprises a cylindrically shaped unified shield carried by each of said support blocks, said unified shield extending around a portion of a circumference of said target that is substantially outside said sputtering zone and having an opening at least as large as said sputtering zone, said opening extending around another portion of said circumference that is substantially inside said sputtering zone and having a length less than a distance between said opposite ends of said target.

15. The apparatus of claim 14 in which said opening is shaped to conform substantially to a shape of a pattern of condensation of vaporized material on said target which forms when the target is held stationary, such that said unified shield shields regions where condensation of vaporized material on said target might otherwise occur at a rate at which deposited condensate is removed from said target structure by sputtering.

16. The apparatus of claim 1 in which said at least one cylindrically shaped shield structure comprises first and second cylindrical shields respectively carried by a first and second support block of said support blocks.

17. The apparatus of claim 16 in which said first and second shields are shaped to conform substantially to a shape of a pattern of condensation of vaporized material on said target which forms when the target is held stationary, said first and second shields being positioned to shield regions where condensation of vaporized material on said target might otherwise occur at a rate at which deposited condensate is removed from said target structure by sputtering.

18. In a method of depositing, in a gaseous atmosphere within a vacuum chamber, a dielectric or an insulating film onto a substrate by sputtering material from a cylindrically shaped target that is rotatably carried at opposite ends thereof by respective support blocks, said target containing magnets non-rotatably held therein in order to establish a sputtering zone extending along a length of the target, said apparatus including an electrical power supply in electrical communication with said target, and said apparatus including at least one cylindrically shaped shield structure carried by at least one of said support blocks and extending over at least one associated end of the target with a space therebetween, an improvement wherein the method comprises a step of interrupting movement of any arc which might otherwise travel across said outside surface by use of at least one annular structure, said at least one annular structure extending around an outside surface thereof and dimensioned to interrupt said movement.

19. The method of claim 18 in which said at least one annular structure has a width that is less than one-half a mean free path of the gas within the vacuum chamber and greater than a width of said arc, said annular structure additionally being radially extended with respect to said outside surface such that a radial extension thereof is greater than said annular structure width.

* * * * *